United States Patent
Helberg et al.

(10) Patent No.: US 10,548,248 B2
(45) Date of Patent: Jan. 28, 2020

(54) SYSTEM AND METHOD OF UNIFIED COOLING SOLUTION IN AN IOT DEVICE

(71) Applicant: Dell Products, LP, Round Rock, TX (US)

(72) Inventors: Christopher M. Helberg, Austin, TX (US); Travis C. North, Cedar Park, TX (US); Tifenn M. Boisard, Cedar Park, TX (US); Deeder M. Aurongzeb, Austin, TX (US)

(73) Assignee: Dell Products, LP, Round Rock, TX (US)

( * ) Notice: Subject to any disclaimer, the term of this patent is extended or adjusted under 35 U.S.C. 154(b) by 0 days.

(21) Appl. No.: 15/040,446

(22) Filed: Feb. 10, 2016

(65) Prior Publication Data
US 2017/0231110 A1 Aug. 10, 2017

(51) Int. Cl.
*H05K 9/00* (2006.01)
(52) U.S. Cl.
CPC .................................. *H05K 9/0022* (2013.01)
(58) Field of Classification Search
CPC ............... H05K 7/2039; H05K 9/0022; H05K 9/00–9/0098; H01L 23/552–23/556
See application file for complete search history.

(56) References Cited

U.S. PATENT DOCUMENTS

| | | | |
|---|---|---|---|
| 5,030,793 A | 7/1991 | McCarthy | |
| 5,241,453 A | 8/1993 | Bright et al. | |
| 5,566,052 A * | 10/1996 | Hughes | H01L 23/367 174/354 |
| 5,726,858 A | 3/1998 | Smith et al. | |
| 5,731,954 A * | 3/1998 | Cheon | F25B 21/02 165/104.33 |
| 5,838,542 A | 11/1998 | Nelson et al. | |
| 6,243,265 B1 | 6/2001 | Wong et al. | |
| 6,282,095 B1 * | 8/2001 | Houghton | H01L 23/3675 165/80.2 |
| 6,309,742 B1 * | 10/2001 | Clupper | B32B 5/18 427/247 |
| 6,400,577 B1 | 6/2002 | Goodwin et al. | |
| 6,445,583 B1 * | 9/2002 | Kline | H01L 23/3675 165/80.3 |
| 6,583,987 B2 | 6/2003 | Skinner et al. | |

(Continued)

OTHER PUBLICATIONS

International Search Report & Written Opinion dated Sep. 23, 2016, for counterpart PCT Application No. PCT/US2016/042091, 11 pages.

*Primary Examiner* — Mukundbhai G Patel
(74) *Attorney, Agent, or Firm* — Prol Intellectual Property Law, PLLC; H. Kenneth Prol

(57) ABSTRACT

A cooling assembly for an IOT wireless gateway device that includes a motherboard structure operatively coupled to one side of a first motherboard component, which is operatively coupled on the other side to one side of a first gap pad for conducting heat, an EMI shield operatively coupled to the other side of the first gap pad and surrounding the sides of the first motherboard component, the EMI shield also operatively coupled to the motherboard structure, the outside of the EMI shield operatively coupled to one side of a second gap pad for conducting heat, and a first heat sink operatively coupled to the other side of the second gap pad for conducting heat.

20 Claims, 5 Drawing Sheets

(56) References Cited

U.S. PATENT DOCUMENTS

| | | | |
|---|---|---|---|
| 6,597,569 B1 * | 7/2003 | Unrein | G06F 1/181 361/679.4 |
| 6,717,799 B2 | 4/2004 | Hamano | |
| 6,795,316 B2 * | 9/2004 | Owens | H05K 7/20809 165/80.3 |
| 6,914,780 B1 * | 7/2005 | Shanker | F28D 15/0233 165/104.33 |
| 6,944,025 B2 | 9/2005 | Hockanson et al. | |
| 7,120,027 B2 | 10/2006 | Yatskov | |
| 7,142,434 B2 * | 11/2006 | Beihoff | H02M 1/44 174/51 |
| 7,232,332 B2 | 6/2007 | Osborn et al. | |
| 7,623,349 B2 | 11/2009 | Refai-Ahmed | |
| 8,085,554 B2 * | 12/2011 | Holdredge | H05K 7/20145 361/794 |
| 8,089,768 B2 * | 1/2012 | Mauder | G02B 6/4494 165/104.33 |
| 8,213,180 B2 * | 7/2012 | Zhao | H01L 21/4878 165/104.33 |
| 8,477,499 B2 * | 7/2013 | Hill | G06F 1/203 361/704 |
| 9,179,538 B2 * | 11/2015 | Foster | H05K 1/0218 |
| 9,363,884 B2 * | 6/2016 | Yang | H05K 7/20472 |
| 9,420,734 B2 * | 8/2016 | Liu | H05K 9/0024 |
| 2001/0046119 A1 * | 11/2001 | Hamano | G06F 1/1616 361/679.54 |
| 2004/0132331 A1 * | 7/2004 | Osborn | H01L 23/4006 439/485 |
| 2006/0255450 A1 * | 11/2006 | Pan | H01L 21/6835 257/712 |
| 2007/0086170 A1 | 4/2007 | Liang | |
| 2008/0285236 A1 * | 11/2008 | Phillips | G02B 6/4246 361/709 |
| 2012/0281360 A1 * | 11/2012 | Nicol | H05K 7/20127 361/704 |
| 2015/0201496 A1 * | 7/2015 | Liao | H05K 1/144 361/721 |

* cited by examiner

SYSTEM AND METHOD OF UNIFIED COOLING SOLUTION IN AN IOT DEVICE

FIELD OF THE DISCLOSURE

The present disclosure generally relates to information handling systems, and more particularly a system and method of a unified cooling solution.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
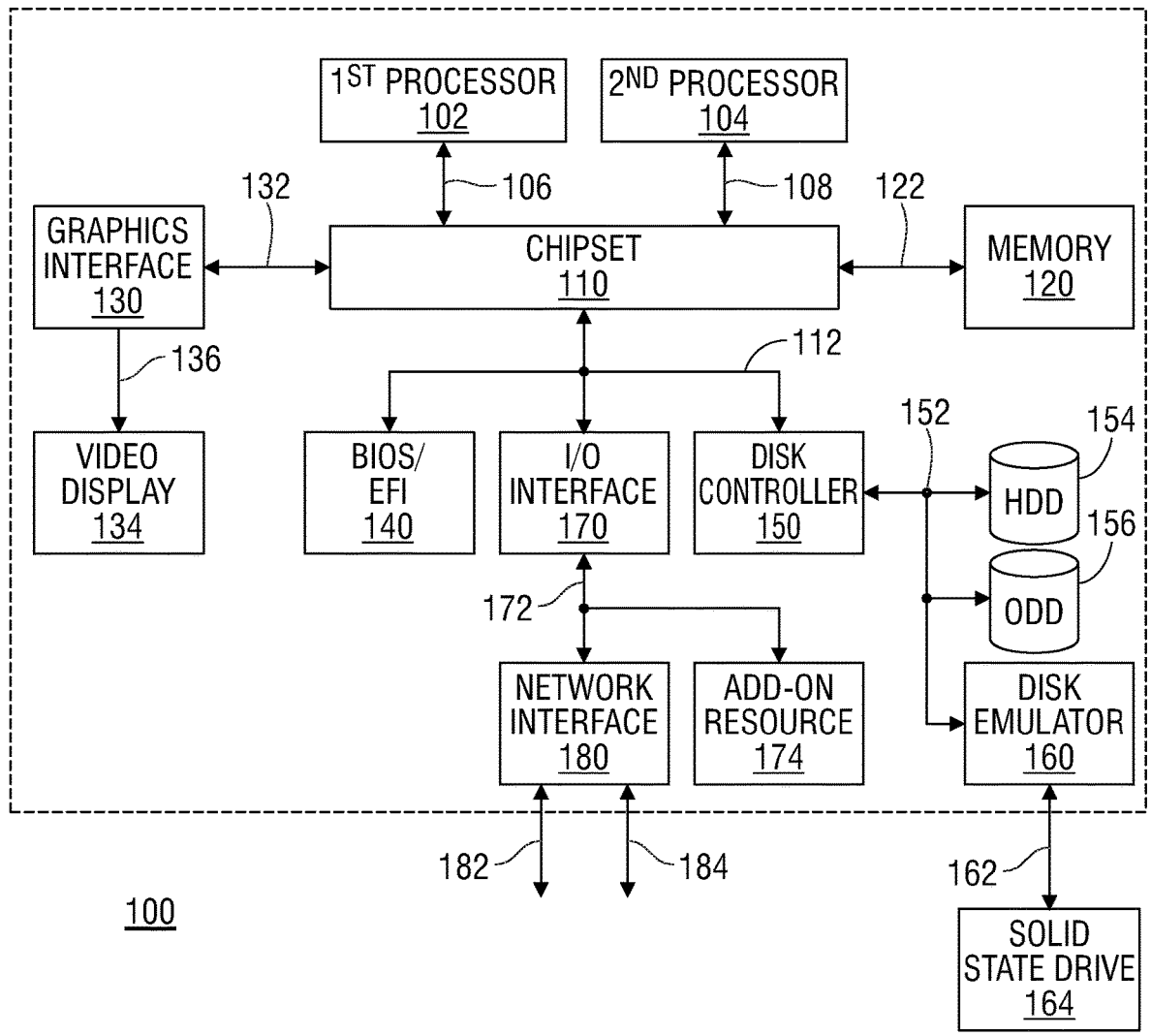
FIG. 1 is a block diagram illustrating an information handling system according to an embodiment of the present disclosure.

FIG. 1 illustrates a generalized embodiment of information handling system 100. FIG. 1 is a block diagram illustrating an information handling system according to an embodiment of the present disclosure. For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 100 can include processing resources for executing machine-executable code, such as a central processing unit (CPU), a programmable logic array (PLA), an embedded device such as a System-on-a-Chip (SoC), or other control logic hardware. Information handling system 100 can also include one or more computer-readable medium for storing machine-executable code, such as software or data. Additional components of information handling system 100 can include one or more storage devices that can store machine-executable code, one or more communications ports for communicating with external devices, and various input and output (I/O) devices, such as a keyboard, a mouse, and a video display. Information handling system 100 can also include one or more buses operable to transmit information between the various hardware components.

Information handling system 100 can include devices or modules that embody one or more of the devices or modules described above, and operates to perform one or more of the methods described above. Information handling system 100 includes a processors 102 and 104, a chipset 110, a memory 120, a graphics interface 130, include a basic input and output system/extensible firmware interface (BIOS/EFI) module 140, a disk controller 150, a disk emulator 160, an input/output (I/O) interface 170, and a network interface 180. Processor 102 is connected to chipset 110 via processor interface 106, and processor 104 is connected to chipset 110 via processor interface 108. Memory 120 is connected to chipset 110 via a memory bus 122. Graphics interface 130 is connected to chipset 110 via a graphics interface 132, and provides a video display output 136 to a video display 134. In a particular embodiment, information handling system 100 includes separate memories that are dedicated to each of processors 102 and 104 via separate memory interfaces. An example of memory 120 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 140, disk controller 150, and I/O interface 170 are connected to chipset 110 via an I/O channel 112. An example of I/O channel 112 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 110 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/EFI module 140 includes BIOS/EFI code operable to detect resources within information handling system 100, to provide drivers for the resources, initialize the resources, and access the resources. BIOS/EFI module 140 includes code that operates to detect resources within information handling system 100, to provide drivers for the resources, to initialize the resources, and to access the resources.

Disk controller 150 includes a disk interface 152 that connects the disc controller to a hard disk drive (HDD) 154, to an optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits a solid-state drive 164 to be connected to information handling system 100 via an external interface 162. An example of external interface 162 includes a USB interface, an IEEE 1194 (Firewire) interface, a proprietary interface, or a combination thereof. Alternatively, solid-state drive 164 can be disposed within information handling system 100.

I/O interface 170 includes a peripheral interface 172 that connects the I/O interface to an add-on resource 174 and to network interface 180. Peripheral interface 172 can be the same type of interface as I/O channel 112, or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral channel 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on separate circuit board or add-in card disposed within information handling system 100, a device that is external to the information handling system, or a combination thereof.

Network interface 180 represents a NIC disposed within information handling system 100, on a main circuit board of the information handling system, integrated onto another component such as chipset 110, in another suitable location, or a combination thereof. Network interface device 180 includes network channels 182 and 184 that provide interfaces to devices that are external to information handling system 100. In a particular embodiment, network channels 182 and 184 are of a different type than peripheral channel 172 and network interface 180 translates information from a format suitable to the peripheral channel to a format suitable to external devices. An example of network channels 182 and 184 includes InfiniBand channels, Fibre Channel channels, Gigabit Ethernet channels, proprietary channel architectures, LTE macrocellular, or a combination thereof. Network channels 182 and 184 can be connected to external network resources (not illustrated). The network resource can include another information handling system, a data storage system, another network, a grid management system, another suitable resource, or a combination thereof.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system can be a personal computer, a consumer electronic device, a network server or storage device, a switch router, wireless router, or other network communication device, a network connected device (cellular telephone, tablet device, etc.), or any other suitable device, and can vary in size, shape, performance, price, and functionality.

The information handling system can include memory (volatile (e.g. random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system can include one or more storage devices, one or more communications ports for communicating with external devices, as well as, various input and output (I/O) devices, such as a keyboard, a mouse, a video/graphic display, or any combination thereof. The information handling system can also include one or more buses operable to transmit communications between the various hardware components. Portions of an information handling system may themselves be considered information handling systems.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a device, such as a Pentium class or PowerPC™ brand processor, or other such device, or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Figure 2:
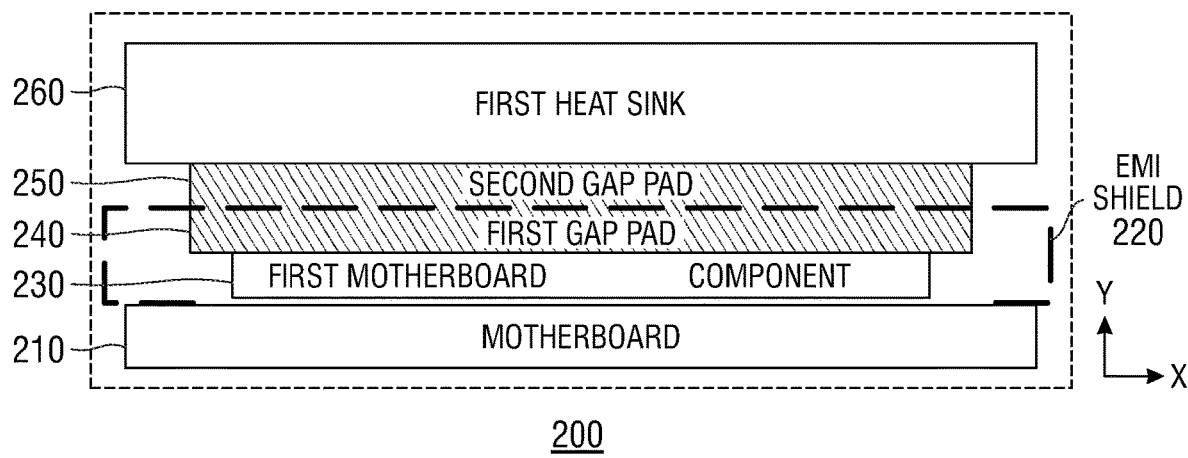
FIG. 2 is a block diagram illustrating a cooling assembly for an internet of things (IOT) wireless gateway device according to an embodiment of the present disclosure.

FIG. 2 is a block diagram illustrating a cooling assembly for an internet of things (JOT) wireless gateway device. FIG. 2 illustrates a first motherboard component 230 in an embodiment operatively coupled to the first outer surface of the motherboard structure 210, as described further below with respect to FIG. 6.

FIG. 2 further illustrates an EMI shield 220 formed with a proximal outer surface, distal outer surface, proximal inner surface, and distal inner surface relative to the motherboard structure 210, as described further below with respect to FIG. 7.

FIG. 2 further illustrates the EMI shield 220 proximal outer surface operatively coupled to the motherboard structure 210 first outer surface to reduce signal interference at said first motherboard component 230, as described further below with respect to FIG. 7.

FIG. 2 further illustrates a first gap pad structure 240 being disposed between the first motherboard component 230 and the proximal inner surface of the EMI shield 220 to conduct heat, a second gap pad structure 250 operatively coupled to the distal outer surface of the EMI shield 220 to conduct heat, and a first heat sink 260 operatively coupled to the second gap pad structure 250 to conduct heat. It is understood that the individual components described above in FIG. 2 may further be separated by other intervening layers of various materials in some embodiments.

The first, and/or second gap pad structures 240, and/or 250, respectively may be any type of thermally conductive filler material, including, but not limited to thermal interface material, phase change material, and/or conductive grease.

The individual components 210-260 plus any additional intervening layers of the cooling assembly 200 for an internet of things (IOT) wireless gateway device according to embodiments of the present disclosure may be operatively coupled using any known coupling method or device, including, but not limited to one or more screws permeating each of the individual components, as shown in FIG. 2, by clips, and/or through the use of adhesive materials disposed between one or more components. The individual components 210-260 plus any additional intervening layers in embodiments may be operatively coupled in a manner that creates increased pressure between or within certain components. For example, in an embodiment, one or more of the gap pads 240 and/or 250 may be kept at a pressure of at least 10 PSI by tightening the screw running through each of the components 210-260, as shown in FIG. 2.

Figure 3:
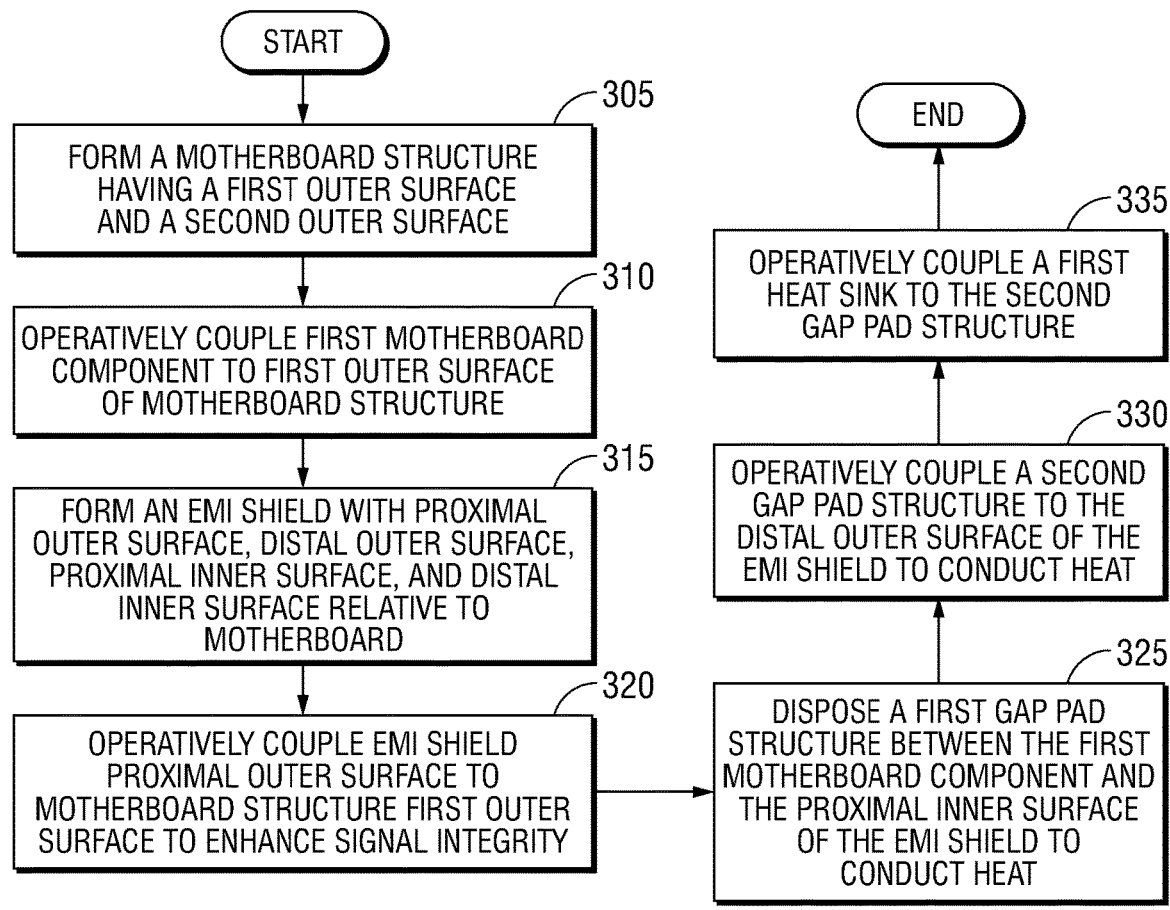
FIG. 3 is a flow diagram illustrating a process of forming a cooling assembly for an IOT device according to an embodiment of the present disclosure.

FIG. 3 is a flow diagram illustrating a process of forming a cooling assembly for an IOT device according to an embodiment of the present disclosure. At block 305, in an embodiment, a motherboard structure may be formed having a first outer surface and a second outer surface. The process of FIG. 3 begins at block 310. In an embodiment, a first motherboard component 230 may be operatively coupled to the first outer surface of the motherboard surface 210, as described in further detail below with respect to FIG. 6.

At block 315, in an embodiment, an EMI shield 220 may be formed with a proximal outer surface, distal outer surface, proximal inner surface, and distal inner surface relative to the motherboard structure 210, as described in more detail below with respect to FIG. 7.

At block 320, in an embodiment, the EMI shield 220 proximal outer surface may be operatively coupled to the motherboard structure 210 first outer surface to reduce signal interference at said first motherboard component 230, as described further below with respect to FIG. 7.

At block 325, in an embodiment, a first gap pad structure 240 may be disposed between the first motherboard component 230 and the proximal inner surface of the EMI shield 220 to conduct heat. At block 330, in an embodiment, a second gap pad structure 250 may be operatively coupled to the distal outer surface of the EMI Shield 220 to conduct heat. At block 335, in an embodiment, a first heat sink 260 may be operatively coupled to the second gap pad structure 250 to conduct heat.

Figure 4:
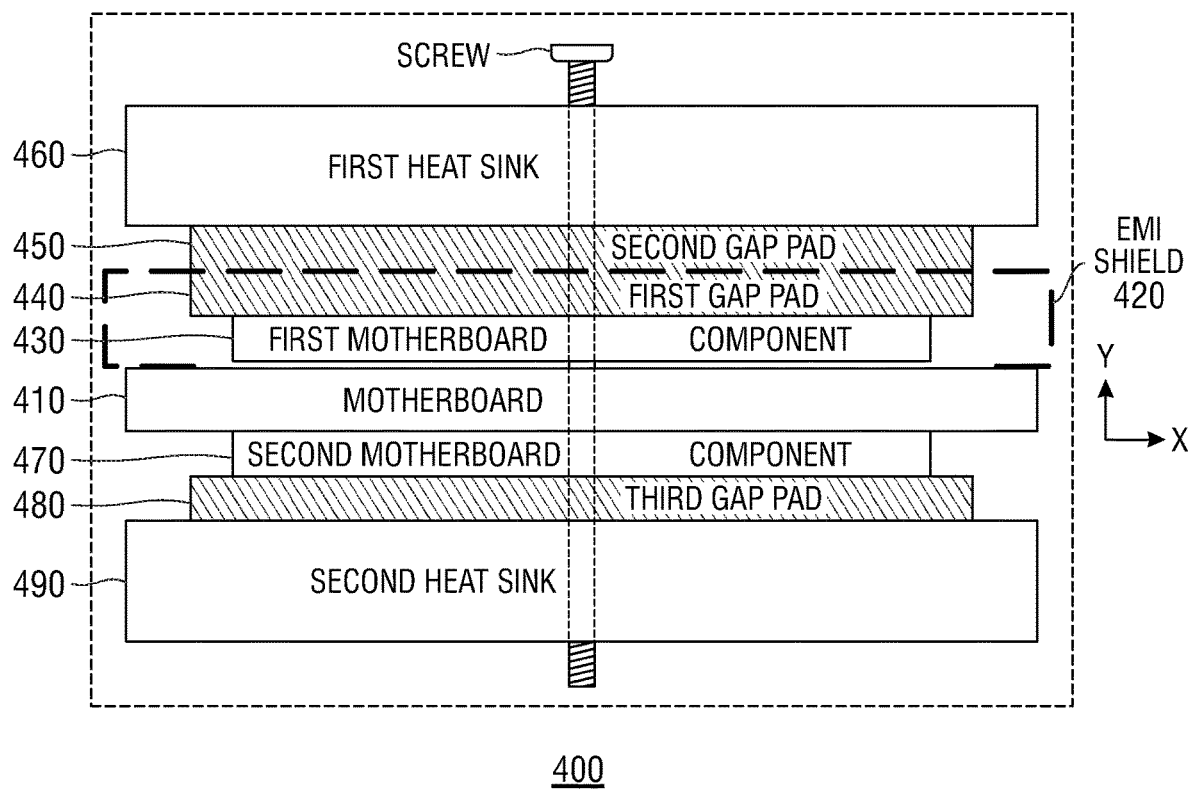
FIG. 4 is a block diagram illustrating a further cooling assembly for an internet of things (JOT) wireless gateway device according to an embodiment of the present disclosure.

FIG. 4 is a block diagram illustrating a further cooling assembly for an internet of things (JOT) wireless gateway device in a further embodiment. FIG. 4 illustrates a first motherboard component 430 in an embodiment operatively coupled to the first outer surface of the motherboard structure 410, as described further below with respect to FIG. 6.

FIG. 4 further illustrates an EMI shield 420 formed with a proximal outer surface, distal outer surface, proximal inner surface, and distal inner surface relative to the motherboard 410, as described further below with respect to FIG. 7.

FIG. 4 further illustrates the EMI shield 420 proximal outer surface operatively coupled to the motherboard structure 410 first outer surface to reduce signal interference at said first motherboard component 430, as described further below with respect to FIG. 7.

FIG. 4 further illustrates a first gap pad structure 440 being disposed between the first motherboard component 430 and the proximal inner surface of the EMI shield 420 to conduct heat, a second gap pad structure 450 operatively coupled to the distal outer surface of the EMI shield 420 to conduct heat, and a first heat sink 460 operatively coupled to the second gap pad structure.

FIG. 4 further illustrates a second motherboard component 470 operatively coupled to the second outer surface of the motherboard structure 410, as described in further detail below with reference to FIG. 6.

FIG. 4 further illustrates a third gap pad structure 480 operatively coupled to the second motherboard component 470 to conduct heat, and a second heat sink 490 operatively coupled to the third gap pad structure 480 to conduct heat. It is understood that the individual components described above in FIG. 4 may further be separated by other intervening layers or various materials in some embodiments.

The first, second, and/or third gap pad structures 440, 450, and/or 480, respectively may be any type of thermally conductive filler material, including, but not limited to thermal interface material, phase change material, and/or conductive grease.

The individual components 410-490 plus any additional intervening layers of the cooling assembly 400 for an internet of things (IOT) wireless gateway device according to embodiments of the present disclosure may be operatively coupled using any known coupling method or device, including, but not limited to one or more screws permeating each of the individual components, as shown in FIG. 4, by clips, and/or through the use of adhesive materials disposed between one or more components. The individual components 410-490 plus any additional intervening layers in embodiments may be operatively coupled in a manner that creates increased pressure between or within certain components. For example, in an embodiment, one or more of the gap pads 440, 450, and/or 480 may be kept at a pressure of at least 10 PSI by tightening the one or more screws running through each of the components 410-490, as shown in FIG. 4. Multiple screws or clips may provide an evened distribution of applied pressure in coupling the components.

Figure 5:
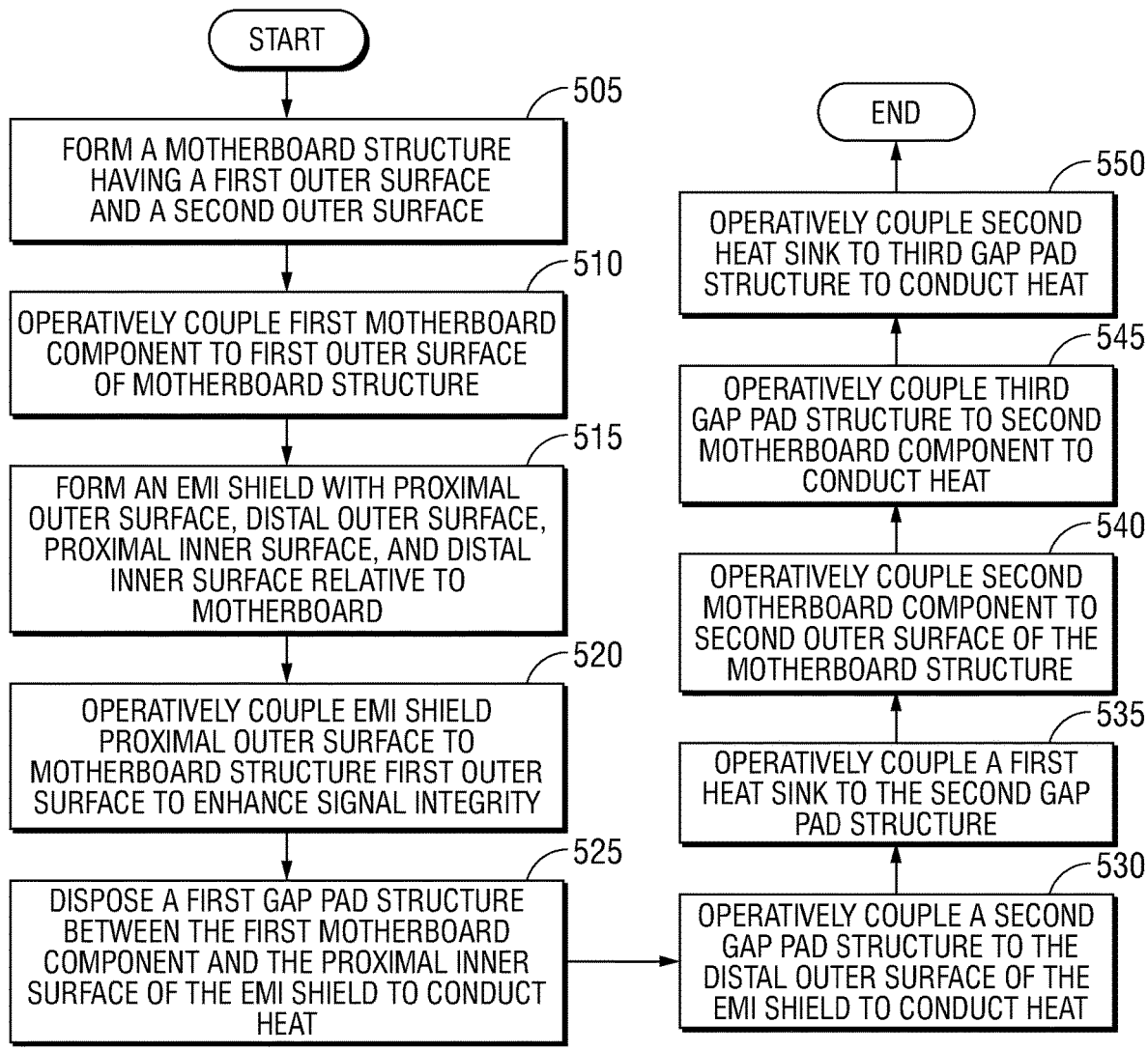
FIG. 5 is a flow diagram illustrating a process of forming a cooling assembly for an IOT device according to an embodiment of the present disclosure.

FIG. 5 is a flow diagram illustrating a process of forming a cooling assembly for an IOT device according to an embodiment of the present disclosure. At block 505, in an embodiment, a motherboard structure may be formed having a first outer surface and a second outer surface. The process of FIG. 5 begins at block 510. In an embodiment, a first motherboard component 430 may be operatively coupled to the first outer surface of the motherboard surface 410, as described in further detail below with respect to FIG. 6.

At block 515, in an embodiment, an EMI shield 420 may be formed with a proximal outer surface, distal outer surface, proximal inner surface, and distal inner surface relative to the motherboard structure 410, as described in more detail below with respect to FIG. 7.

At block 520, in an embodiment, the EMI shield 420 proximal outer surface may be operatively coupled to the motherboard structure 410 first outer surface to reduce signal interference at said first motherboard component 430, as described further below with respect to FIG. 7.

At block 525, in an embodiment, a first gap pad structure 440 may be disposed between the first motherboard component 430 and the proximal inner surface of the EMI shield 420 to conduct heat. At block 530, in an embodiment, a second gap pad structure 450 may be operatively coupled to the distal outer surface of the EMI Shield 420 to conduct heat. At block 535, in an embodiment, a first heat sink 460 may be operatively coupled to the second gap pad structure 450 to conduct heat. At block 540, in an embodiment, a second motherboard component 470 may be operatively coupled to the second outer surface of the motherboard structure 410, as shown in further detail below with reference to FIG. 6.

At block 545, in an embodiment a third gap pad structure 480 may be operatively coupled to the second motherboard component 470 to conduct heat. At block 350, in an embodiment, a second heat sink 490 may be operatively coupled to the third gap pad structure 480 to conduct heat.

It is understood that the method steps described above in FIG. 5 may be performed in any order and that some or all steps may not be performed in every embodiment. In other embodiments, it is understood that additional steps may be performed in any combination.

Figure 6:
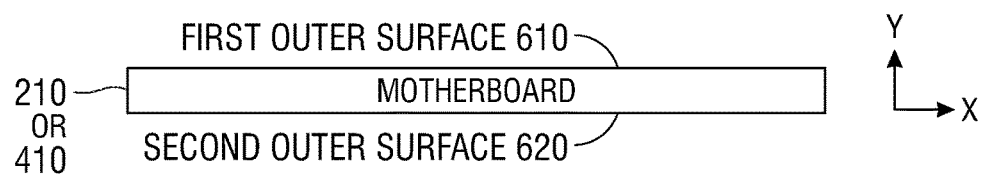
FIG. 6 is a block diagram illustrating a motherboard structure in an embodiment having a first outer surface and a second outer surface according to an embodiment of the present disclosure.

FIG. 6 is a block diagram illustrating a motherboard structure in an embodiment having a first outer surface and a second outer surface. A motherboard structure in an embodiment may include one or more dual in-line memory module (DIMM) and/or one or more central processing unit (CPU). These DIMMs and CPUs may be attached to the motherboard on either side (i.e. the side of the motherboard structure closest to first motherboard component structure, or the side of the motherboard structure closest to the second motherboard component structure). A motherboard structure in an embodiment may include any or all of the components 102-160, and 170-180, shown in FIG. 1 as comprising the information handling system 100.

In an embodiment, a first motherboard structure 210 may have a first outer surface 610 and a second outer surface 620. Also in an embodiment, a first motherboard component 230 may be operatively coupled to the first outer surface 610 of the motherboard structure 210, as described further above with respect to FIG. 2 and with respect to block 310 in FIG. 3.

In a further embodiment, a first motherboard structure 410 may have a first outer surface 610 and a second outer surface 620. Also in a further embodiment, a first motherboard component 430 may be operatively coupled to the first outer surface 610 of the motherboard surface 410, as described in further detail above with respect to FIG. 4 and with respect to block 510 in FIG. 5. In a further embodiment, a second motherboard component 470 may be operatively coupled to the second outer surface 620 of the motherboard structure 410, as described in further detail above with reference to FIG. 4 and at block 540 in FIG. 5.

Figure 7:
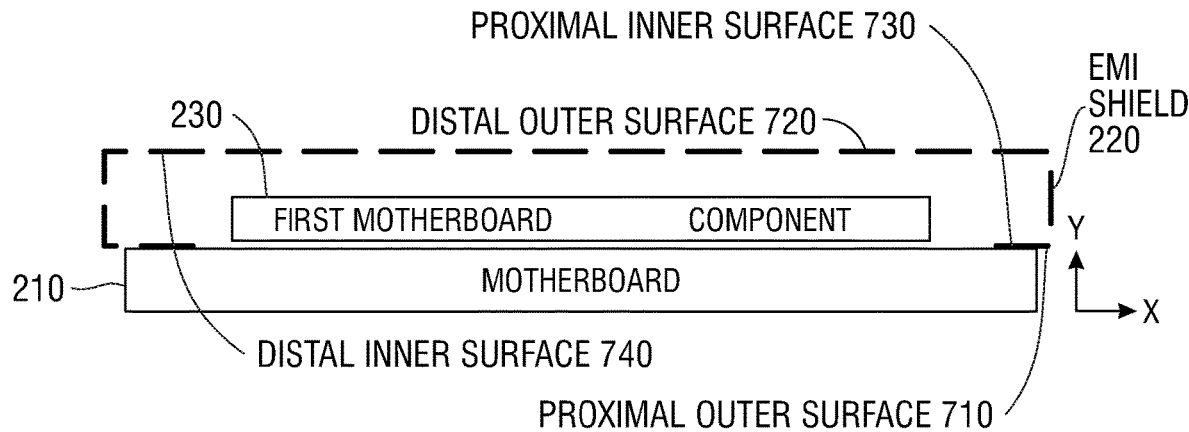
FIG. 7 is a block diagram illustrating an EMI shield formed in an embodiment with a proximal outer surface, a distal outer surface, a proximal inner surface, and a distal inner surface relative to a motherboard structure according to an embodiment of the present disclosure.

FIG. 7 is a block diagram illustrating an EMI shield formed in an embodiment with a proximal outer surface, a distal outer surface, a proximal inner surface, and a distal inner surface relative to a motherboard structure. In an embodiment an EMI shield 220 may be formed with a proximal outer surface 710, a distal outer surface 720, a proximal inner surface 730, and a distal inner surface 740 relative to the motherboard structure 210, as discussed in greater detail above with respect to FIG. 2, and with respect to block 320 of FIG. 3. Also in an embodiment, a first gap pad structure 240 may be disposed between the first motherboard component 230 and the proximal inner surface 730 of the EMI shield 220 to conduct heat, as discussed above in greater detail with reference to FIG. 2, and with reference to block 325 of FIG. 3. Also in an embodiment, a second gap pad structure 250 may be operatively coupled to the distal outer surface 720 of the EMI shield 220 to conduct heat, as discussed in greater detail above with respect to FIG. 2, and with respect to block 330 in FIG. 3.

In a further embodiment an EMI shield 220 corresponding to 420 in FIG. 4 may be formed with a proximal outer surface 710, a distal outer surface 720, a proximal inner surface 730, and a distal inner surface 740 relative to the motherboard structure 410, as discussed in greater detail above with respect to FIG. 4, and with respect to block 520 of FIG. 5. Also in an embodiment, a first gap pad structure 240 corresponding to 440 in FIG. 4 may be disposed between the first motherboard component 230 (corresponding to 430 in FIG. 4) and the proximal inner surface 730 of the EMI shield 220 to conduct heat, as discussed above in greater detail with reference to FIG. 4, and with reference to block 525 of FIG. 5. Also in an embodiment, a second gap pad structure 450 may be operatively coupled to the distal outer surface 720 of the EMI shield 220 corresponding to 420 I FIG. 4 to conduct heat, as discussed in greater detail above with respect to FIG. 4, and with respect to block 530 in FIG. 5.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A cooling assembly for an TOT wireless gateway device comprising:
    a motherboard structure having a first outer surface and a second outer surface and a first motherboard component operatively coupled to the first outer surface of the motherboard structure;
    an EMI shield having a proximal outer surface, a distal outer surface, a proximal inner surface, and a distal inner surface relative to the motherboard structure, wherein the EMI proximal outer surface is operatively coupled to the motherboard structure and is substantially parallel to the distal outer surface such that the motherboard structure encloses the EMI shield around the first motherboard component;
    the first thermally conductive gap pad disposed between said first motherboard component and the distal inner surface of the EMI shield to conduct heat emanating from the first motherboard component or motherboard structure;
    a second thermally conductive gap pad operatively coupled to the distal outer surface of the EMI shield to conduct the heat emanating from the first motherboard component or motherboard structure and disposed to limit contact between the EMI shield and a first heat sink;
    wherein a screw is disposed through the motherboard structure, the first motherboard component, the first thermally conductive gap pad, the EMI shield, the second thermally conductive gap pad, and the first heat sink such that the screw operatively couples together the motherboard structure, the first motherboard component, the first thermally conductive gap pad, the EMI shield, the second thermally conductive gap pad, and the first heat sink; and
    the first heat sink operatively coupled to the second thermally conductive gap pad to conduct the heat emanating from the first motherboard component or motherboard structure.

2. The cooling assembly for the TOT wireless gateway device of claim 1, further comprising a second motherboard component operatively coupled to the second outer surface of the motherboard structure, a third thermally conductive gap pad operatively coupled to the second motherboard component to conduct heat emanating from the second motherboard component or motherboard structure, and a second heat sink operatively coupled to the third thermally conductive gap pad to conduct the heat emanating from the second motherboard component or motherboard structure.

3. The cooling assembly for the TOT wireless gateway device of claim 1, wherein the EMI shield reduces signal interference at said first motherboard component.

4. The cooling assembly for the TOT wireless gateway device of claim 1, wherein the EMI shield has EMI shield sides, and wherein the EMI shield sides, the distal inner surface, and the first motherboard structure surface encapsulate the first motherboard component.

5. The cooling assembly for the TOT wireless gateway device of claim 1, wherein the first thermally conductive gap pad, and the second thermally conductive gap pad comprise thermally conductive gap filler material.

6. The cooling assembly for an IOT wireless gateway device of claim 1, wherein the motherboard structure, the motherboard component, the first thermally conductive gap pad, the EMI shield, the second thermally conductive gap pad, and the first heat sink are operatively connected such that the first thermally conductive gap pad and the second thermally conductive gap pad are held at a pressure of at least 10 PSI.

7. The cooling assembly for the IOT wireless gateway device of claim 1, wherein the first thermally conductive gap pad is a thermal interface material.

8. A process of forming a cooling assembly for an IOT wireless gateway device comprising:
    forming a motherboard structure having a first outer surface and a second outer surface;
    operatively coupling a first motherboard component to the first outer surface of the motherboard structure;
    forming an EMI shield having a proximal outer surface, a distal outer surface, a proximal inner surface, and a distal inner surface relative to the motherboard structure, wherein the EMI proximal outer surface is operatively coupled to the motherboard structure and is substantially parallel to the distal outer surface such that the motherboard structure encloses the EMI shield around the first motherboard component;
    operatively coupling the EMI shield proximal outer surface to the motherboard structure first outer surface to enhance signal integrity;
    disposing a first thermally conductive gap pad between a first motherboard component and a proximal inner surface of the EMI shield to conduct heat emanating from the first motherboard component or motherboard structure;
    operatively coupling a second thermally conductive gap pad to the distal outer surface of the EMI shield to conduct the heat emanating from the first motherboard component or motherboard structure, disposed to limit contact between the EMI shield and a first heat sink;
    operatively coupling the motherboard structure, the first motherboard component, the first thermally conductive gap pad, the EMI shield, the second thermally conductive gap pad, and the first heat sink by disposing a screw through the motherboard structure, the first motherboard component, the first thermallyc conductive gap pad, the EMI shield, the second conductive gap pad, and the first heat sink; and
    operatively coupling the first heat sink to the second thermally conductive gap pad to conduct the heat emanating from the first motherboard component or motherboard structure.

9. The process of claim 8, further comprising operatively coupling a second motherboard component to the second outer surface of the motherboard structure, operatively coupling a third thermally conductive gap pad to the second motherboard component to conduct heat emanating from the second motherboard component or motherboard structure, and operatively coupling a second heat sink to the third thermally conductive gap pad to conduct heat.

10. The process of claim 8, wherein the EMI shield reduces signal interference at said first motherboard component.

11. The process of claim 8, wherein the EMI shield has EMI shield sides, and wherein the EMI shield sides, the distal inner surface, and the first motherboard structure surface encapsulate the first motherboard component.

12. The process of claim 8, wherein the first thermally conductive gap pad comprises comprise a thermally conductive gap filler material.

13. The process of claim 8, wherein the first thermally conductive gap pad is a phase change material.

14. The process of claim 8, further comprising operatively coupling the motherboard structure, the motherboard component, the first thermally conductive gap pad, the EMI shield, the second thermally conductive gap pad, and the first heat sink such that the first thermally conductive gap pad and the second thermally conductive gap pad are held at a pressure of at least 10 PSI.

15. A cooling assembly for an TOT wireless gateway device comprising:
a motherboard structure having a first outer surface and a second outer surface and a first motherboard component operatively coupled to the first outer surface of the motherboard structure;
an EMI shield having a proximal outer surface, a distal outer surface, a proximal inner surface, and a distal inner surface relative to the motherboard structure, wherein the EMI proximal outer surface is operatively coupled to the motherboard structure and is substantially parallel to the distal outer surface;
the EMI shield proximal outer surface operatively coupled to the motherboard structure first outer surface such that the motherboard structure encloses the EMI shield around the first motherboard component;
a first thermally conductive gap pad disposed between said first motherboard component and the distal inner surface of the EMI shield to conduct heat emanating from the motherboard structure or the first motherboard component;
a second thermally conductive gap pad operatively coupled to the distal outer surface of the EMI shield to conduct the heat emanating from the motherboard structure or the first motherboard component;
the first and second gap pad structures disposed to fill air gaps between a surface of the first motherboard component, and a surface of a first heat sink;
the first heat sink operatively coupled to the second thermally conductive gap pad to conduct heat emanating from the motherboard structure or the first motherboard component;
a second motherboard component operatively coupled to the second outer surface of the motherboard structure;
a third thermally conductive gap pad operatively coupled to the second motherboard component to conduct the heat emanating from the motherboard structure or the second motherboard component;
wherein a screw is disposed through the motherboard structure, the first motherboard component, the first thermally conductive gap pad, the EMI shield, the second thermally conductive gap pad, and the first heat sink such that the screw operatively couples together the motherboard structure, the first motherboard component, the first thermally conductive gap pad, the EMI shield, the second thermally conductive gap pad, and the first heat sink; and
a second heat sink operatively coupled to the third thermally conductive gap pad to conduct heat emanating from the motherboard structure or the second motherboard component.

16. The cooling assembly for the TOT wireless gateway device of claim 15, wherein the EMI shield reduces signal interference at said first motherboard component.

17. The cooling assembly for the TOT wireless gateway device of claim 15, wherein the EMI shield has EMI shield sides, and wherein the EMI shield sides, the distal inner surface, and the first motherboard structure surface encapsulate the first motherboard component.

18. The cooling assembly for the IOT wireless gateway device of claim 15, wherein the first thermally conductive gap pad, the second thermally conductive gap pad, and the third thermally conductive gap pad comprises a thermally conductive gap filler material.

19. The cooling assembly for the IOT wireless gateway device of claim 15, wherein the first thermally conductive gap pad is a conductive grease.

20. The cooling assembly for an IOT wireless gateway device of claim 15, wherein the motherboard structure, the motherboard component, the first thermally conductive gap pad, the EMI shield, the second thermally conductive gap pad, and the first heat sink are operatively connected such that the first thermally conductive gap pad and the second thermally conductive gap pad are held at a pressure of at least 10 PSI.

* * * * *